United States Patent [19]
Frasca

[11] Patent Number: 5,698,856
[45] Date of Patent: Dec. 16, 1997

[54] SPECIMEN HOLDER FOR ELECTRON MICROSCOPE

[76] Inventor: Peter Frasca, 10 Callison La., Voorhees, N.J. 08043

[21] Appl. No.: 692,386

[22] Filed: Aug. 5, 1996

[51] Int. Cl.⁶ .................................................. H01J 37/20
[52] U.S. Cl. ............................................... 250/440.11
[58] Field of Search .................... 250/440.11, 442.11, 250/310, 311

[56] References Cited

U.S. PATENT DOCUMENTS

| | | | |
|---|---|---|---|
| 2,849,619 | 8/1958 | Eisfeldt | 250/440.11 |
| 3,643,091 | 2/1972 | Lucas | 250/440.11 |
| 4,024,402 | 5/1977 | Schomburg et al. | 250/442.11 |
| 4,163,900 | 8/1979 | Warren et al. | 250/440.11 |
| 4,596,934 | 6/1986 | Yanaka et al. | 250/442.11 |
| 4,797,261 | 1/1989 | Swann et al. | 422/102 |
| 5,225,683 | 7/1993 | Suzuki et al. | 250/442.11 |
| 5,367,171 | 11/1994 | Aoyama et al. | 250/443.1 |

Primary Examiner—Kiet T. Nguyen
Attorney, Agent, or Firm—Norman E. Lehrer

[57] ABSTRACT

A specimen holder for an electron microscope comprises an elongated member with an upper surface and a lower surface. The elongated member further has an opening formed therethrough. Secured to the upper surface of the elongated member around the opening is a carbon tape. An adhesive is present on the exposed surfaces of the carbon tape in order to facilitate the securement of the tape onto the specimen holder and to secure a plurality of specimen grids to the upper surface of the specimen holder and across the opening formed therethrough.

11 Claims, 2 Drawing Sheets

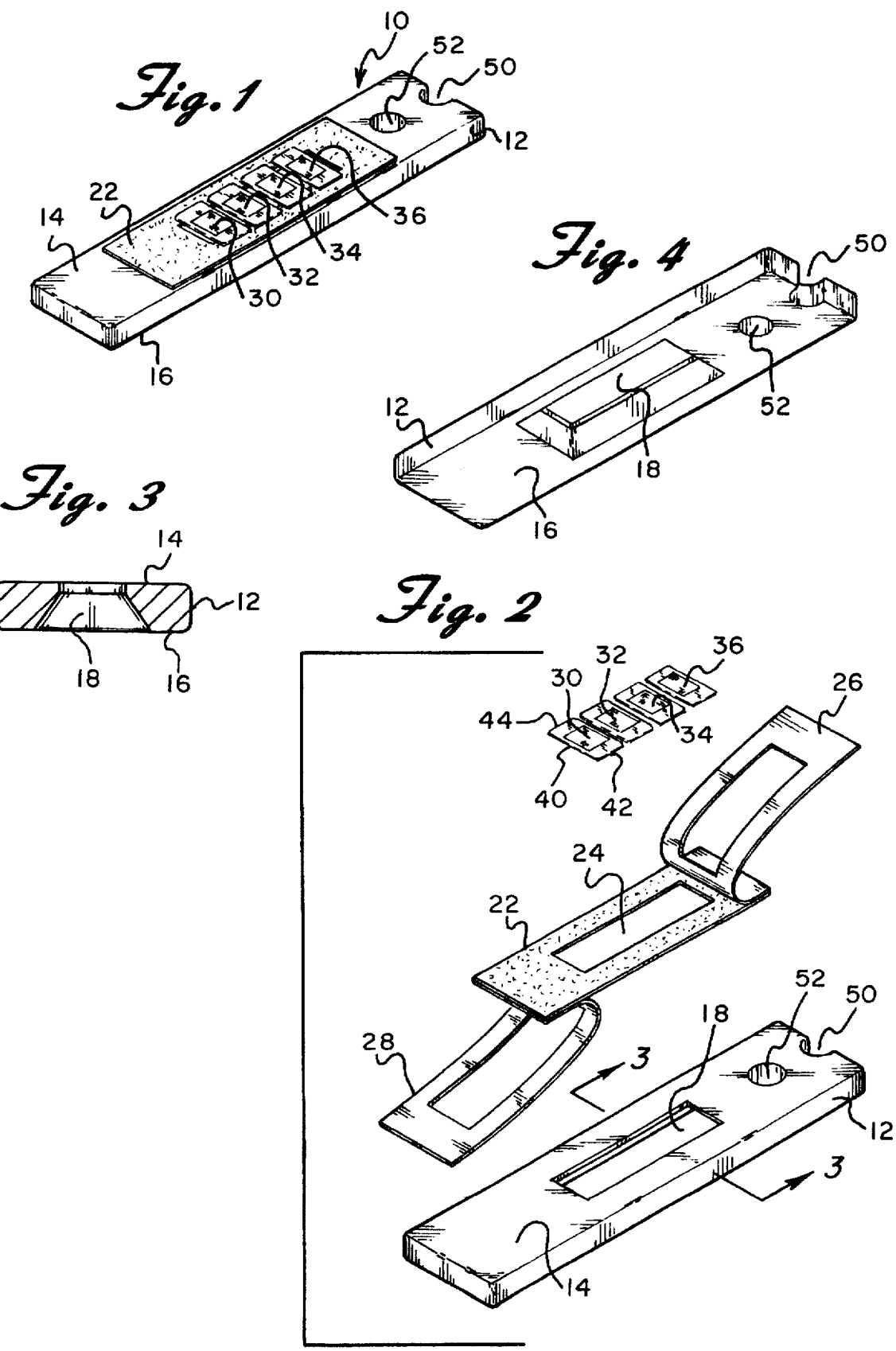

SPECIMEN HOLDER FOR ELECTRON MICROSCOPE

BACKGROUND OF THE INVENTION

The present invention is directed toward a specimen holder for an electron microscope and, more particularly, to such a holder that supports a plurality of specimen grids.

In order to conveniently examine a plurality of specimens under an electron microscope, specimen holders or cartridges are commonly utilized. A number of specimen grids are mounted in the specimen holder. In use, the specimen holder is inserted into a support rod or arm which is transversely movable through the axis of an electron particle beam emitted from the microscope. The individual specimen grids are investigated through the microscope's glass viewer as they are passed through the electron beam. The position of the support rod is adjustable so that different regions of the grids can be examined.

U.S. Pat. No. 3,643,091 to Lucas shows an example of such a specimen holder. The Lucas holder contains a number of holes, each of which is adapted to receive a corresponding specimen grid. The specimen grids are secured in the holder below the upper surface of the same. Once the specimen grids have been examined, they are removed from the specimen holder and separately stored. Since the individual specimen grids are quite small, it is tedious to remove them from the holder. Further, the storing of such small grids is inconvenient. This is especially true when a large number of grids are to be handled and stored.

Another drawback with the Lucas holder is that X-ray analysis cannot be adequately performed because the grids are positioned below the surface of the holder, thus preventing effective escape and collection of X-rays from the specimen. Furthermore, since the metal holder is not shielded from the electron beam, X-rays characteristic of the composition of the metal holder are generated and collected which can interfere with proper X-ray analysis of the specimen.

U.S. Pat. No. 4,797,261 to Swann et al. discloses a copper specimen holder for electron microscopes. Once again, the specimen grids are removed from the holder after examination and before storage. This holder is specifically designed to transfer into the microscope grids while kept cold but, as in the Lucas design, grids are positioned below the surface of the metal (copper) holder and the metal holder is not shielded thus similarly rendering inadequate X-ray analysis of the specimen.

SUMMARY OF THE INVENTION

The present invention is designed to overcome the deficiencies of the prior art discussed above. It is an object of the invention to provide a specimen holder for an electron microscope which is inexpensive to manufacture.

It is a further object of the invention to provide such a holder which can be conveniently stored.

It is yet another object of the invention to provide a specimen holder which has a shape conducive to X-ray analysis.

In accordance with the illustrative embodiments, demonstrating features and advantages of the present invention, there is provided a specimen holder for an electron microscope which comprises an elongated member with an upper surface and a lower surface. The elongated member further has an opening formed therethrough. Adhesively secured to the upper surface of the elongated member around the opening is a layer of adhesive carbon tape. Adhesive is also present on the exposed surface of the carbon tape which facilitates the securement of a plurality (up to five) of specimen grids to the upper surface of the specimen holder and across the opening formed therethrough.

Other objects, features and advantages of the invention will be readily apparent from the following detailed description of a preferred embodiment thereof taken in conjunction with the drawings.

BRIEF DESCRIPTION OF THE DRAWINGS

For the purpose of illustrating the invention, there is shown in the accompanying drawings one form which is presently preferred; it being understood that the invention is not intended to be limited to the precise arrangements and instrumentalities shown.

FIG. 1 is a top perspective view of the specimen holder of the present invention;

FIG. 2 is an exploded perspective view of the present invention;

FIG. 3 is a cross-sectional view taken along lines 3—3 of FIG. 2;

FIG. 4 is a bottom perspective view of the specimen holder with the specimen grids removed;

DETAILED DESCRIPTION OF THE PREFERRED EMBODIMENT

Figure 5:
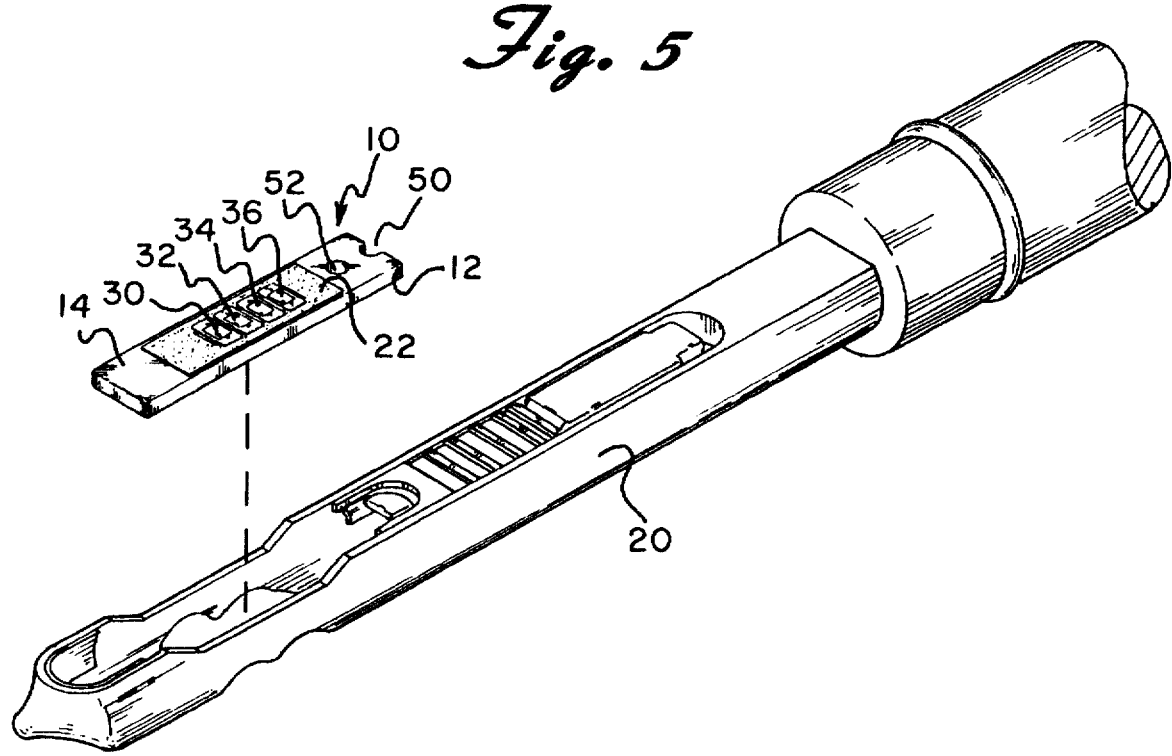
FIG. 5 is a perspective view of the specimen holder illustrating the manner in which it is to be mounted in the specimen holder arm.

Referring now to the drawings in detail wherein like reference numerals have been used throughout the various figures to designate like elements, there is shown in the figures a specimen holder for an electron microscope constructed in accordance with the principles of the present invention and designated generally as 10.

The specimen holder 10 includes an elongated member 12 which has an upper surface 14 and a lower surface 16. An opening 18 is formed through the elongated member 12. In the preferred embodiment, the opening 18 is flared outwardly toward the bottom surface 16 of the elongated member 12 as best illustrated in FIGS. 3 and 4.

Figure 6:
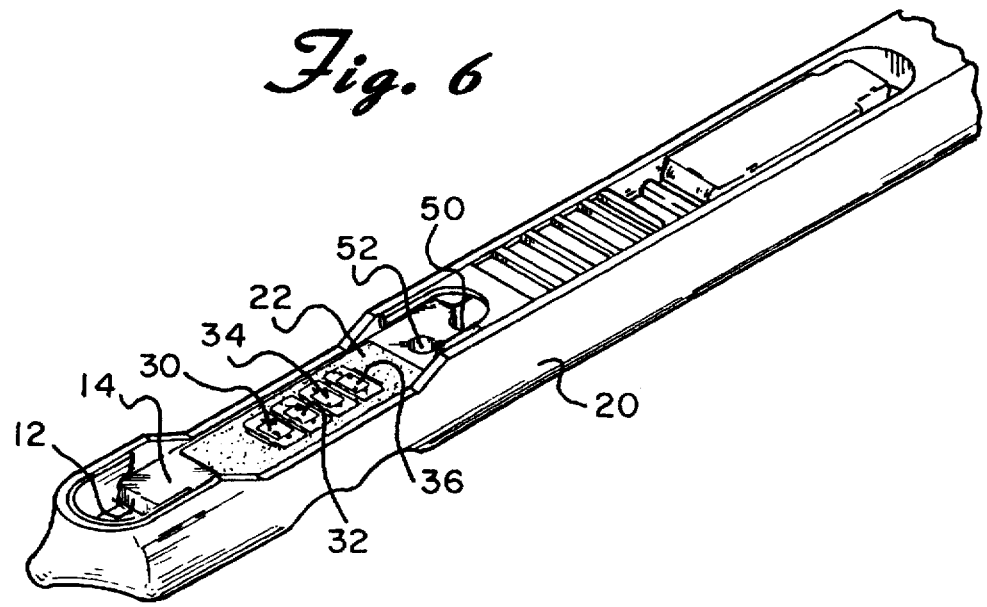
FIG. 6 is a perspective view of the specimen holder mounted in the specimen holder arm.

The elongated member 12 is preferably rectangular in shape so that it can be properly mounted in a specimen holder arm 20 of the type generally known in art (FIGS. 5 and 6). The elongated member 12 is preferably 1.125" (2.85 cm) long, 0.225" wide (0.57 cm), and 0.063" (0.16 cm) thick. The preferred material for the elongated member is copper. However, it can be comprised of a variety of other materials such as aluminum, beryllium, carbon, brass, stainless steel, nylon, etc.

A layer of carbon tape 22 is provided. The tape has an opening 24 formed therethrough which has the same size and shape as the opening 18 formed through the elongated member 12. Pressure sensitive adhesive is present on both sides of the carbon tape 22. Each side of the carbon tape is covered with a protective release backing 26 and 28 (FIG. 2). The backings are preferably comprised of polyethylene. However, they can be comprised of other material such as paper.

The carbon tape 22 is secured to the elongated member by removing the release backing 28 and positioning the tape around the perimeter of the opening 18 in the elongated member 12. Once the carbon tape is secured to the upper surface 14 of the elongated member 12, the release backing 26 is removed in order to expose the adhesive on the exposed surface of the carbon tape 22.

A plurality of specimen grids 30, 32, 34, and 36 are adhesively secured to the carbon tape 22 adjacent the upper surface 14 of the elongated member 12 in the manner described below. Each of the specimen grids is substantially identical to the other grids. Accordingly, only one of the grids will be described in detail, it being understood that the description applies equally to the other grids. It should also be understood that while four such grids are shown in the drawings, this is by way of example only. It is possible to produce the specimen holder with more or less than four depending on the size of the grids. Typically, five such grids are utilized.

The specimen grid 30 is surrounded by a frame 40 which has a pair of opposing ends 42 and 44 (FIG. 2). The frame is preferably comprised of the same material as the elongated member 12. Each end 42 and 44 of the specimen grid 30 is secured to the adhesive backed carbon tape 22 so that the specimen grid is positioned over the opening 24 in the tape 22 and, therefore, over the opening 18 in the elongated member 12.

After all of the specimen grids have been similarly secured to the upper surface 14 of the elongated member 12, the specimen holder 10 is positioned in the specimen holder arm 20 as illustrated in FIGS. 5 and 6. The specimen arm 20 is mounted for rotation and axial movement in an electron microscope housing (not shown) so that the angle at which the electron beam hits the individual specimen grids can be adjusted. Since the bottom of the opening 18 is flared outwardly, if the specimen holder is tilted when the electron beam passes through the specimen grid, the beam does not contact any part of the specimen holder 10.

Further, the carbon tape 22, which is positioned around the opening 18 in the elongated member 12, effectively prevents spurious X-rays caused by part of the electron beam hitting the elongated member 12. However, since some of the elongated member may be contacted by the electron beam it is preferred that the specimen grids and the elongated member be comprised of the same material. This ensures that only one "false" elemental reading will be taken if the electron beam hits the specimen grid or the holder itself.

Since the specimen holder of the present invention is comprised of copper or other similarly inexpensive materials as mentioned above, the holder can be removed from the specimen holder arm once the examination of the specimen grids has been completed and placed in a storage container. Heretofore, the specimen grids analyzed for X-ray analysis were removed from the specimen holders because the holders were expensive due to their composition of graphite or beryllium, which are rather fragile and thus difficult to machine.

The removal of the specimen holder 10 from the specimen holder arm 20 is facilitated by a groove or recess 50 formed in one end of the elongated member. The recess 50 allows a thin implement (not shown) to partially lift the holder 10 out of the specimen holder arm 20 so that the holder can be grasped and transported to the proper storage location. In the preferred embodiment, a small hole 52 is formed through the elongated member 12 adjacent the curved portion. The hole 52 can also receive a small implement therein to facilitate the removal of the holder 10 from the holder arm 20 and the subsequent transportation thereof. The recess 50 and hole 52 also function to properly orient the specimen holder 10 so that it will always be clear as to which is the front or rear end.

The present invention may be embodied in other specific forms without departing from the spirit or essential attributes thereof and accordingly reference should be made to the appended claims rather than to the foregoing specification as indicating the scope of the invention.

What is claimed is:

1. A specimen holder for an electron microscope comprising:

an elongated member having an upper surface and a lower surface, said elongated member having an opening formed therethrough;

a carbon layer secured to said upper surface of said elongated member around said opening, said carbon layer having an exposed surface, and said exposed surface of said carbon layer having an adhesive thereon.

2. The specimen holder of claim 1 wherein said elongated member is substantially rectangular in shape.

3. The specimen holder of claim 1 wherein said elongated member is comprised of a material selected from the group consisting of copper, aluminum, carbon, brass, stainless steel and beryllium.

4. The specimen holder of claim 1 wherein said elongated member is comprised of nylon.

5. The specimen holder of claim 1 wherein said opening is flared outwardly toward said lower surface of said elongated member.

6. The specimen holder of claim 1 further including means for facilitating the transportation of the elongated member.

7. The specimen holder of claim 1 further including a plurality of specimen grids, each of said specimen grids being secured to said adhesive on said exposed surface of said carbon layer and extending across said opening.

8. The specimen holder of claim 7 wherein said specimen grids and said elongated member are comprised of the same material.

9. The specimen holder of claim 8 wherein said specimen grids and said elongated member are comprised of a material selected from the group consisting of copper, aluminum, carbon, brass, stainless steel and beryllium.

10. The specimen holder of claim 8 wherein said specimen grids and said elongated member are comprised of nylon.

11. The specimen holder of claim 7 wherein said elongated member is substantially rectangular in shape.

* * * * *